United States Patent [19]

Wakamatsu

[11] Patent Number: 5,120,677
[45] Date of Patent: Jun. 9, 1992

[54] METHOD FOR MAKING A SEMICONDUCTOR DEVICE BY DOPING WITH ARSENIC, OF AT LEAST 25 WT. % INTO A POLYSILICON LAYER

[75] Inventor: Hidetoshi Wakamatsu, Tokyo, Japan

[73] Assignee: Oki Electric Industry Co., Ltd., Tokyo, Japan

[21] Appl. No.: 613,544

[22] PCT Filed: Mar. 20, 1990

[86] PCT No.: PCT/JP90/00372
§ 371 Date: Nov. 15, 1990
§ 102(e) Date: Nov. 15, 1990

[87] PCT Pub. No.: WO90/11618
PCT Pub. Date: Oct. 4, 1990

[30] Foreign Application Priority Data
Mar. 23, 1989 [JP] Japan .................. 1-69353

[51] Int. Cl.⁵ .......................... H01L 00/00
[52] U.S. Cl. ...................... 437/164; 437/60; 437/240; 148/DIG. 35; 148/DIG. 133
[58] Field of Search ............ 437/60, 160, 164, 919, 437/240, 982; 148/DIG. 35, DIG. 123, DIG. 14, DIG. 133

[56] References Cited

U.S. PATENT DOCUMENTS

| | | | |
|---|---|---|---|
| 3,798,081 | 3/1974 | Beyer | 437/240 |
| 4,521,441 | 6/1985 | Flowers | 437/164 |
| 4,521,441 | 6/1985 | Flowers | 437/164 |
| 4,725,564 | 2/1988 | van Dalen | 437/164 |
| 4,755,486 | 7/1988 | Treichel et al. | 437/164 |

FOREIGN PATENT DOCUMENTS

| | | |
|---|---|---|
| 264858 | 4/1988 | European Pat. Off. . |
| 2172099 | 9/1973 | France . |
| 0046272 | 4/1978 | Japan ........ 437/164 |
| 0039050 | 2/1987 | Japan . |
| 0239571 | 10/1987 | Japan . |
| 63-84149 | 4/1988 | Japan . |
| 1384206 | 2/1975 | United Kingdom . |

Primary Examiner—Brian E. Hearn
Assistant Examiner—C. Chaudhari
Attorney, Agent, or Firm—Edward D. Manzo

[57] ABSTRACT

A method for introducing an impurity into a polysilicon formed on an insulating film is described. A silicate glass layer (13) containing As is formed on a polysilicon layer (12) formed on an insulating film (2) and is thermally treated to introduce As into the polysilicon layer (12). The silicate glass layer (13) has a concentration of arsenic of not less than 25 wt. %, calculated as As₂O₃ and the thermal treatment is effected in an atmosphere of a mixed gas of N₂ and O₂ with an oxygen partial pressure ratio of 0.05–0.7 at not lower than 1000° C. for not shorter than 60 minutes.

10 Claims, 10 Drawing Sheets

METHOD FOR MAKING A SEMICONDUCTOR DEVICE BY DOPING WITH ARSENIC, OF AT LEAST 25 WT. % INTO A POLYSILICON LAYER

TECHNICAL FIELD

This invention relates to a method for fabricating a semiconductor device and more particularly, to a method for diffusing an impurity in a polysilicon layer formed on an insulating layer.

BACKGROUND OF THE INVENTION

For a cell of dynamic random access memories (hereinafter referred to as a DRAM), there has been hitherto widely employed a memory cell of a one transistor one capacitor type using one switching transistor and one capacitor. A recent trend toward miniaturization of memory cells for achieving a high density of DRAM is so remarkable that it is now difficult to provide adequate capacitance of on a scaled down capacitor unless a three-dimensional structure is used.

To meet the requirement in this field of techniques, there has been developed a DRAM where stacked capacitors are buried in grooves. For instance, a BSCC (buried stacked capacitor cell) has been proposed in Nikkei Micro Devices Independent Volume No. 1, entitled "The Whole Aspect of 4M DRAM Starting Toward Practical Applications" p. 215-220, (1987).

FIG. 2 shows a sectional view of such a known semiconductor memory device. On part of a P-type silicon substrate 101 is formed a field oxide film 102. A groove 103 is formed in the silicon substrate 101 at the end of the field oxide film 102. The groove 103 has a thick oxide film 104 formed in the inner walls thereof. A capacitor consisting of a capacitor electrode 106 consisting of a polysilicon film, a dielectric thin film 107 and a cell plate electrode 108 is formed on the thick oxide film 104. The capacitor electrode 106 is connected with one diffused layer 111a of an adjacent transfer gate transistor at a contact 105 thereof. The transfer gate transistor is constituted of an oxide film 109, a data electrode 110 and diffused layers 111a, 111b forming a source and a drain, respectively. The diffused layer 111b of the transfer gate transistor is connected to a bit wire 114 through a contact hole provided in a layer insulation film 112. The transfer gate transistor and the capacitor are protected with a passivation film 115.

The capacitor electrode 106 is formed by solid phase diffusion of an impurity from an impurity-containing silicate glass film in the polysilicon film in an atmosphere of an inert gas. (See Journal of Electrochemical Society, August, 1972, Vol. 119, No. 8, pp. 1080-1084.)

However, the above-described solid phase diffusion technique involves the problem that the impurity cannot be satisfactorily introduced into the polysilicon film in the groove.

If the thermal treating temperature is raised or the thermal treating time is prolonged in order to permit the impurity to be introduced sufficiently in the polysilicon, the junction at the time of formation of an N+ diffused layer portion or the contact portion with the cell capacitor becomes deep, with an attendant problem that the element separability between cells is lowered.

Furthermore, when $N_2$ is used as an atmospheric gas for the thermal treatment, regions where the concentration of the impurity is high will be locally formed in the silicate film after the thermal treatment, resulting in a non-uniform concentration distribution of the impurity in the polysilicon film. This leads to the problem that a deposit in the form of a film or fine crystals serving to suppress the diffusion of the impurity is formed at the interface between the silicate film and the polysilicon film.

The present invention has for its object the provision of a method for fabricating a semiconductor device wherein an impurity can be satisfactorily introduced into a polysilicon film.

The invention has for another object the provision of a method wherein an impurity can be introduced into a polysilicon film in a groove without lowering the element separability between cells.

SUMMARY OF THE INVENTION

For introduction of an impurity into a polysilicon formed on an oxide film on a semiconductor substrate according to the invention, a silicate glass film having a concentration of arsenic of not less than 25 wt %, calculated as $As_2O_3$, is formed on the polysilicon and thermally treated in an atmosphere of a mixed gas of $N_2$ and $O_2$ with the ratio of the oxygen partial pressure to the total pressure ranging between 0.05/1-0.7/10 at not lower than 1000° C. for not shorter than 60 minutes.

When a mixed gas of $N_2$ and $O_2$ is used as the atmospheric gas for the thermal treatment and the ratio in partial pressure of oxygen, $[O_2/(N_2+O_2)]$, is set in a range of 0.05-0.7, the locally high concentration of arsenic in the arsenic-containing silicate glass film (hereinafter referred to simply as AsSG film) and the occurrence of a deposit formed at the interface between the AsSG film and the polysilicon film can be prevented.

The thermal treatment of the invention should be effected in an atmosphere of a mixed gas with an oxygen partial pressure of 0.05-0.7. The conditions that the oxygen partial pressure ratio is 0.05-0.7 are necessary for introducing an impurity in the polysilicon film to a satisfactory extent. The use of the mixed gas of $N_2$ and $O_2$ is for the following reason: with $N_2$ alone, a deposit serving to suppress diffusion of As at the interface between the AsSG film and the polysilicon film is formed; and with $O_2$ alone, As in the polysilicon film is taken up in the oxide film on the surface of the polysilicon film, so that the concentration of As in the polysilicon film is inconveniently decreased.

BEST MODE FOR CARRYING OUT THE INVENTION

Embodiments of the invention are described in detail with reference to the accompanying drawings.

FIG. 1 is a sectional view of a fabrication process along the direction of a bit line of a semiconductor memory showing one embodiment of the invention.

Initially, a p-type silicon single crystal substrate 1 (hereinafter referred to simply as silicon substrate) having an impurity concentration of approximately $1 \times 10^{15} - 1 \times 10^{16}$ cm$^{-3}$ is provided. The silicon substrate 1 is formed at a memory cell thereof with a P well with a concentration of approximately $5 \times 10^{16} - 2 \times 10^{17}$ cm$^{-3}$ and a depth of approximately 5 μm. Subsequently, according to the LOCOS (selective oxidation) method, a i field oxide film (SiO$_2$) 2 is formed in a thickness of approximately 6000 angstroms and is removed by etching approximately 2000 angstroms, followed by forming a silicon oxide film 3 in a thickness of approximately 300-500 angstroms on the surface of the silicon substrate where any field oxide film 2 has not been formed.

Figure 1A:
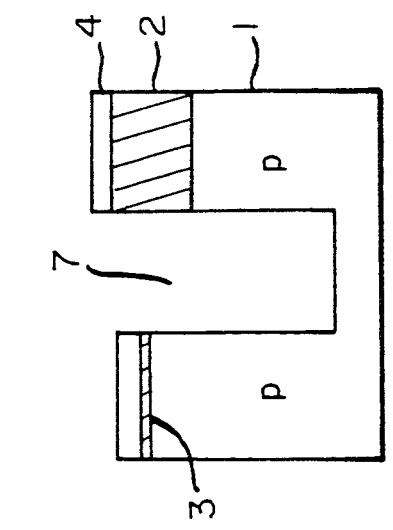
FIG. 1 is a sectional view showing a production process of a DRAM cell according to a preferred embodiment of the invention.

Subsequently, a silicon nitride film 4 is deposited on the entire surface of the silicon substrate according to a reduced pressure CVD technique in about 1000-3000 angstroms, followed by further deposition of a silicon oxide film 5 over the entire surface of the silicon nitride film 4 according to an atmospheric CVD method in about 4000-7000 angstroms [see FIG. 1(a)].

Figure 1B:
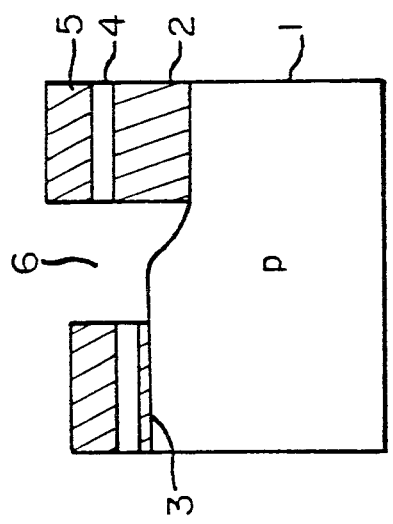

Thereafter, according to an ordinary photolithography, the silicon oxide film 5 and the silicon nitride film 4 are, successively, subjected to patterning to form an opening 6, and the exposed field oxide film 2 is removed by dry etching [see FIG. 1(b)].

Figure 1C:
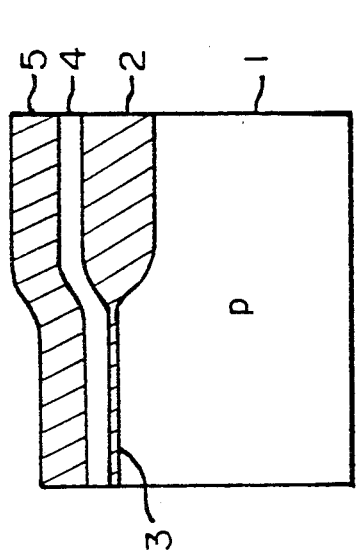

Then, reactive ion etching (RIE) with a very strong anisotropy is carried out through the silicon oxide film 5 used as a mask, thereby forming a groove 7 having a depth of about 4 .m and substantially vertical side walls in the silicon substrate 1, after which the silicon oxide film 5 used as the mask is removed [see FIG. 1(c)].

Figure 1D:
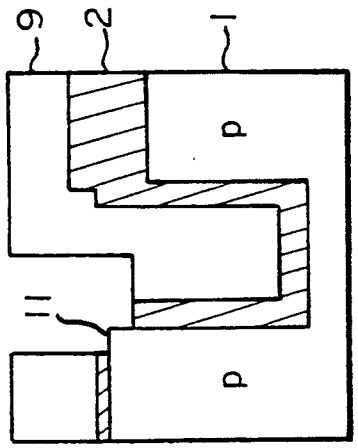
Figure 1E:
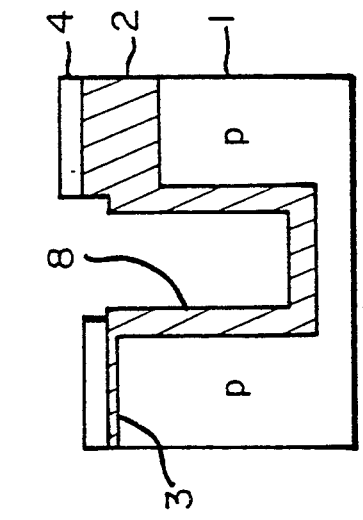

The silicon substrate 1 which is exposed is oxidized in an atmosphere of wet oxygen through the silicon nitride film 4 used as an oxidation-resistant mask, thereby forming a silicon oxide film 8 with a thickness of approximately 1000-1500 angstroms on the side and bottom surfaces of the groove 7 see FIG. 1(d)].

After removal of the silicon nitride film 4, a resist 9 is subjected to patterning according to an ordinary photolithography. The silicon oxide film 8 at the shoulder of the groove 7 is removed by etching through the mask of the resist 9, thereby forming a cell contact portion 11 [see FIG. 1(e)].

Then, the resist 9 is removed, after which a polysilicon film (capacitor electrode) 12 is deposited over the entire surface of the silicon substrate according to a low-pressure CDV method in approximately 1500-2000 angstroms. In order to lower the sheet resistance of the polysilicon film 12, solid phase diffusion is performed using an AsSG film 13, by which As is incorporated in the polysilicon film 12. The thermal treatment for this purpose is effected under conditions of an oxygen partial pressure ratio of about 0.2, 1000° C. and 60 minutes so as to introduce the impurity of a high concentration in the crystal grains of the polysilicon film 12 [see FIG. 1(f)].

Figure 3:
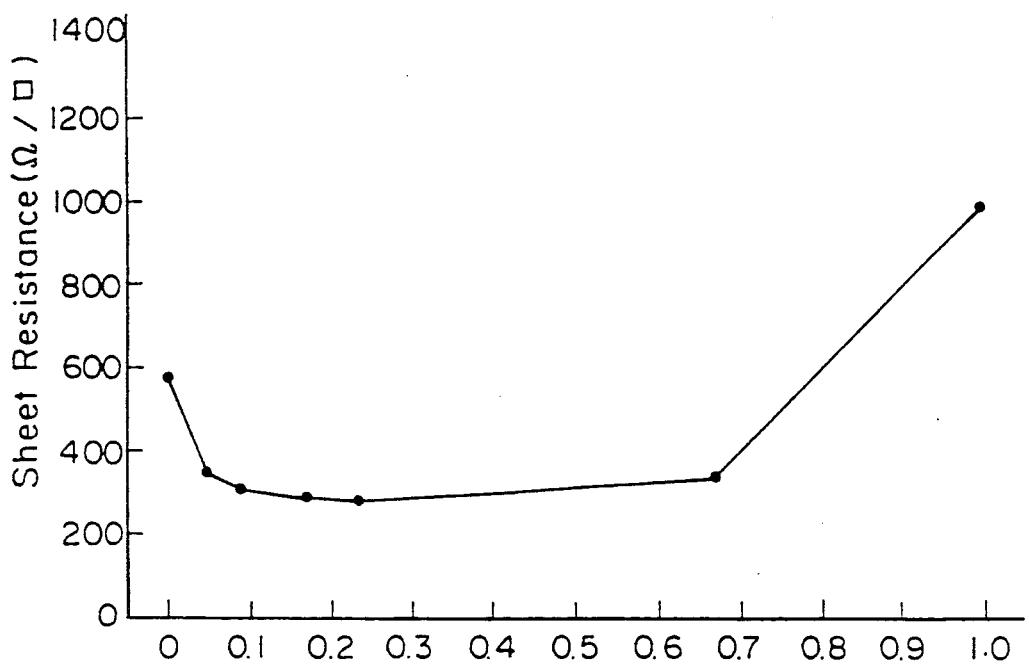
FIG. 3 is a graph showing the relation between the sheet resistance of a polysilicon film and the oxygen partial pressure ratio in an atmospheric gas used for thermal treatment.

FIG. 3 shows the relation between the sheet resistance of the polysilicon film and the oxygen partial pressure.

As shown in the figure, the sheet resistance is about 600Ω/□ in a conventional N$_2$ atmosphere. In contrast, using a mixed gas of N$_2$ and O$_2$ and an oxygen partial pressure ratio ranging 0.05-0.7 according to the invention, the sheet resistance is about 300Ω/□, revealing that the polysilicon film is incorporated with the impurity to a satisfactory extent.

Figure 4:
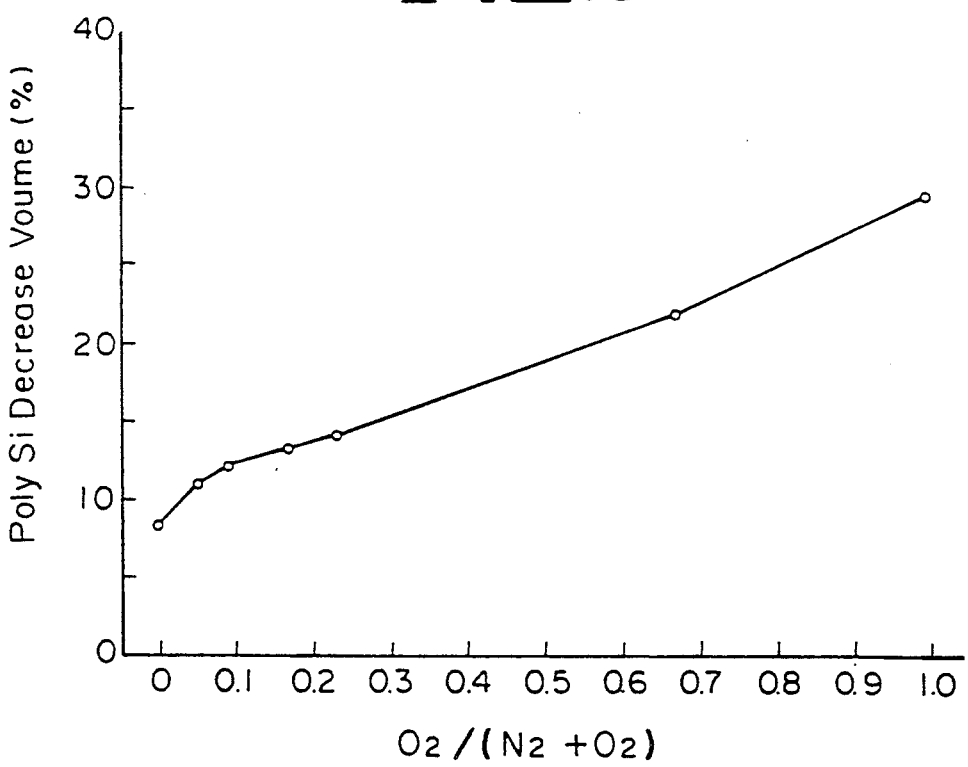
FIG. 4 is a graph showing the relation between the decreasing amount of a polysilicon film and the oxygen partial pressure ratio in atmospheric gas used for thermal treatment.

FIG. 4 shows the relation between (1) the reduction in volume of the polysilicon film after the thermal treatment and (2) the oxygen partial pressure ratio.

As will be apparent from the figure, as compared with the reduction in volume of the polysilicon film in the conventional N$_2$ atmosphere, the use of a mixed gas of N$_2$ and O$_2$ with an oxygen partial pressure ratio of 0.05-0.7 according to the invention results in a slight increase in the reduction in volume of the polysilicon film. Thus, it has been found that such use can control the thickness of the polysilicon film to be adequately kept in relation to the variation in the oxygen partial pressure during the thermal treatment.

Figure 5:
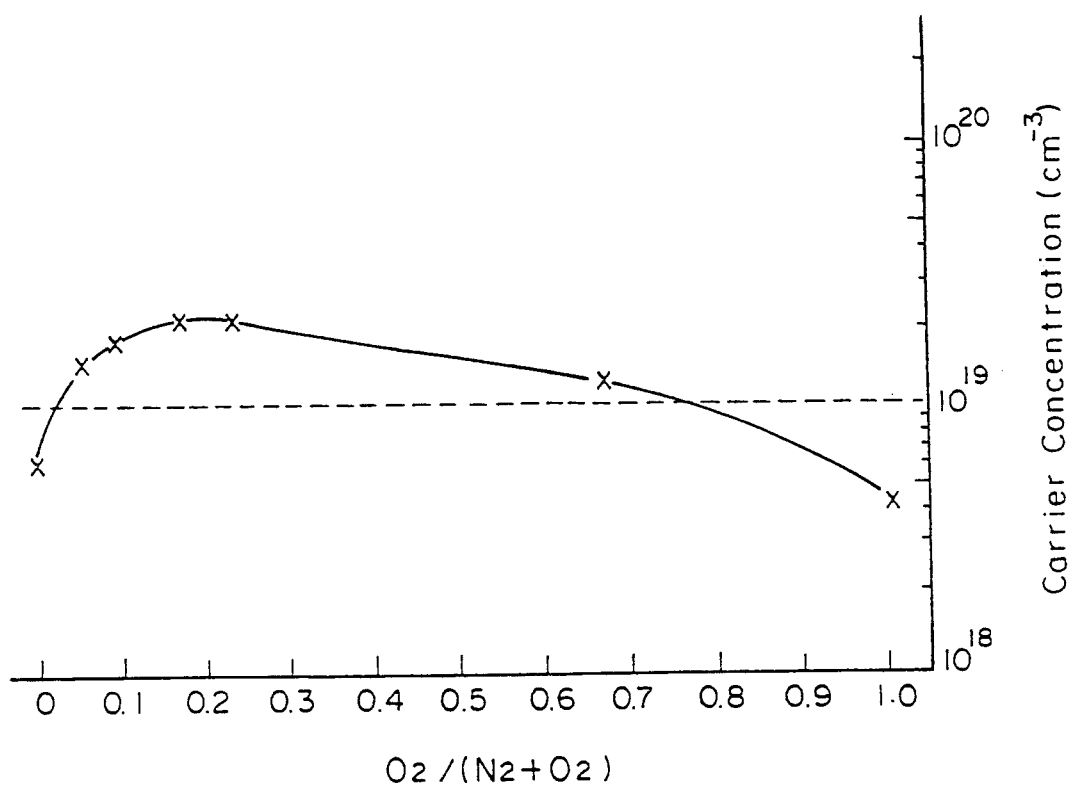
FIG. 5 is a graph showing the relation between the carrier concentration of As in a polysilicon film and the oxygen partial pressure ratio in an atmospheric gas used for thermal treatment.

FIG. 5 shows the relation between the concentration of arsenic (carrier concentration) electrically activated in the AsSG film after the thermal treatment and the oxygen partial pressure ratio.

It has been usually accepted that the carrier concentration should preferably be not less than $1 \times 10^{19}$ cm$^{-3}$. From the figure, it will be seen that within an oxygen partial pressure ratio of 0.05-0.7, the carrier concentration is not less than $1 \times 10^{19}$ cm$^{-3}$.

It will be noted that in FIGS. 3, 4 and 5, the thickness of the AsSG film is 4000 angstroms, the concentration of As is 25 wt % as As$_2$O$_3$, and the thermal treating conditions include a temperature of 1000° C. and a time of 60 minutes.

Figure 6:
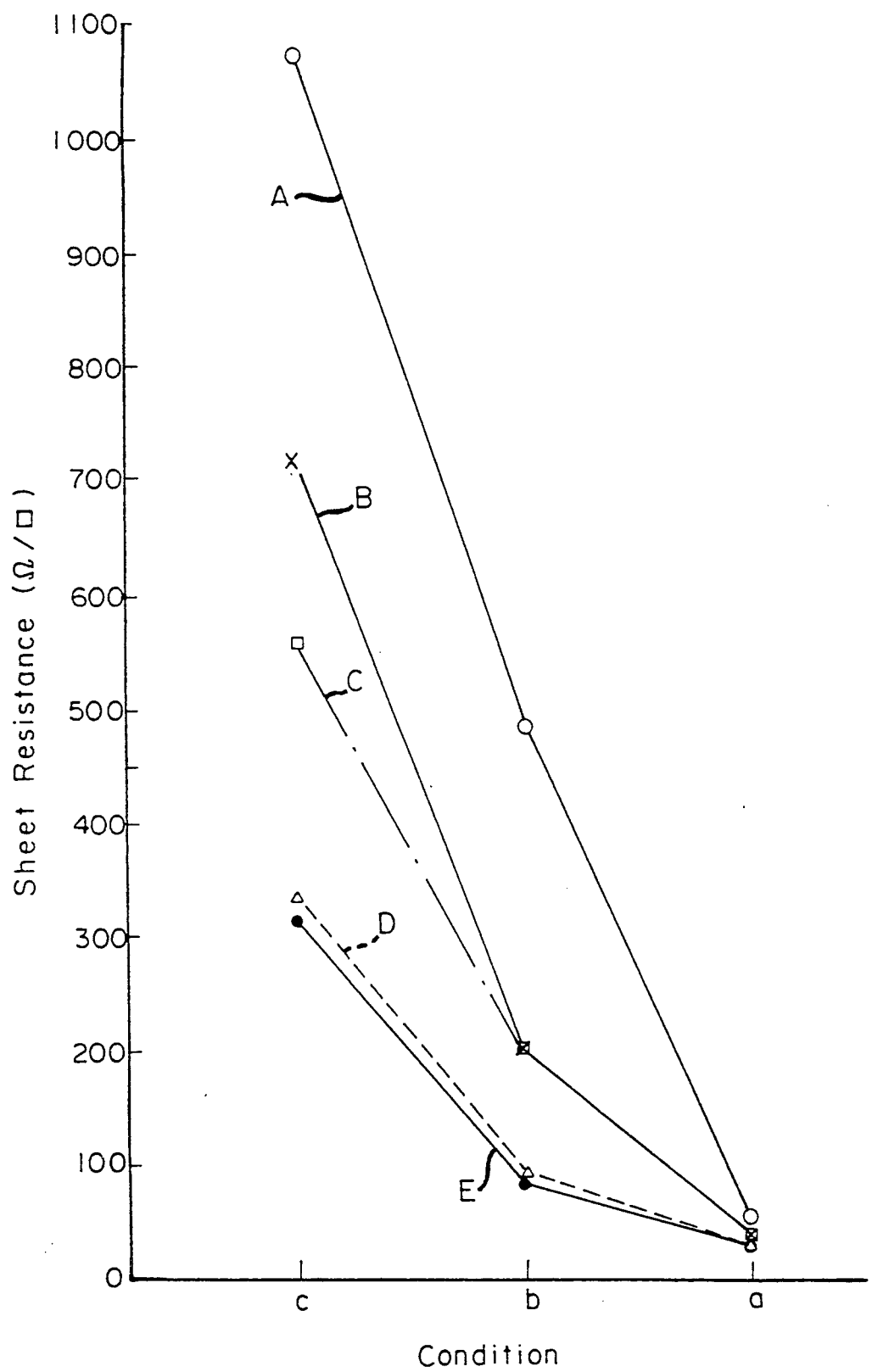
FIG. 6 is a graph showing the relation between the sheet resistance and the position where As is introduced, for three different positions of forming the polysilicon film and introducing As from an AsSG film and for different atmospheric gases, temperatures and times for the thermal treatment.
Figure 7A:
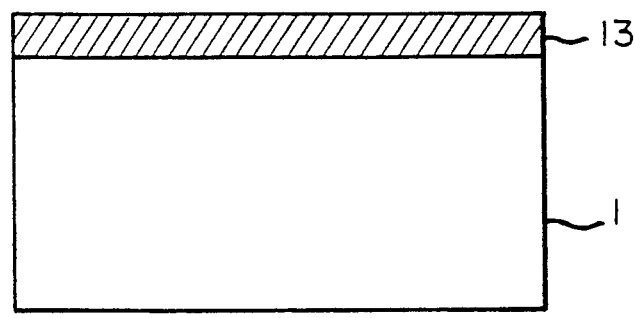
FIG. 7 is a view showing particular conditions of FIG. 6.
Figure 7B:
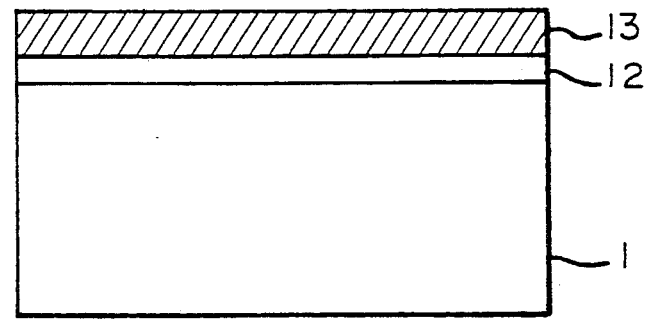
Figure 7C:
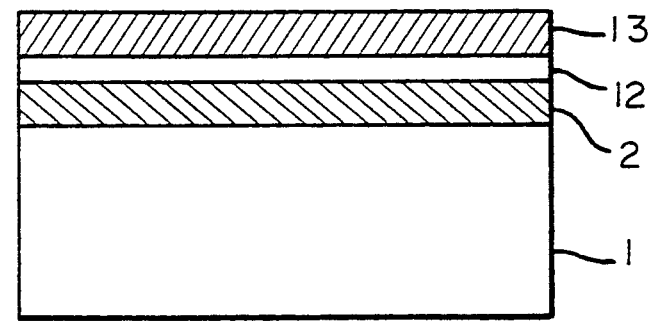

The use of a mixed gas of N$_2$ and O$_2$ for the solid phase diffusion in a semiconductor substrate using an AsSG film as a diffusion source is known as disclosed in Japanese Laid-open Patent Application Nos. 63-160326 and 53-46272. In this connection, we made a comparison test using the AsSG film 13 as a diffusion source according to the following three cases: (a) a case of solid phase diffusion in the semiconductor substrate 1 (see FIG. 7(a)), (b) a case where solid phase diffusion is effected on the polysilicon film 13 directly formed on the semiconductor substrate 1 (see FIG. 7(b)), and (c) a case where solid phase diffusion is effected on the polysilicon film 13 formed on the semiconductor substrate 1 through the SiO$_2$ film 2 (see FIG. 7(c)). In this experiment, the AsSG film 13 has a thickness of 4000 angstroms and contains 25 wt % of As$_2$O$_3$, the polysilicon film 12 has a thickness of 1500 angstroms, and the substrate 1 is a Si substrate. The results of the experiment are shown in FIG. 6. The conditions for the data A–E in FIG. 6 are those shown in the following table.

TABLE

| | Atmospheric Gas | Temperature (°C.) | Time (minutes) |
|---|---|---|---|
| A | $N_2 + 10\% O_2$ | 950 | 60 |
| B | $N_2$ | 950 | 60 |
| C | $N_2 + 10\% O_2$ | 1000 | 20 |
| D | $N_2 + 67\% O_2$ | 1000 | 60 |
| E | $N_2 + 10\% O_2$ | 1000 | 60 |

As will be seen from FIG. 6, when the AsSG film 13 is formed directly on the Si substrate 1 and the solid phase diffusion is effected (the case of (a)), there is no significant difference in the sheet resistance value of the diffused Si substrate 1 irrespective of the atmospheric gas, temperature and time. With the case where the solid phase diffusion is effected from the AsSG layer 13 formed on the polysilicon film 12 in the polysilicon film 12 formed on the Si substrate 1 (case of (b)), the sheet resistances of the polysilicon film 12 differ depending on the atmospheric gas, the temperature and the time. With the case where the solid phase diffusion is effected from the AsSG film 13 which has been formed on the Si substrate through the $SiO_2$ film 2 (case of (c)), the sheet resistance of the polysilicon film 12 does not reach 300 Ω unless the atmosphere gas is $N_2+O_2$ (10% or 67%), the temperature is not lower than 1000° C. and the time is 60 minutes or more.

Figure 8:
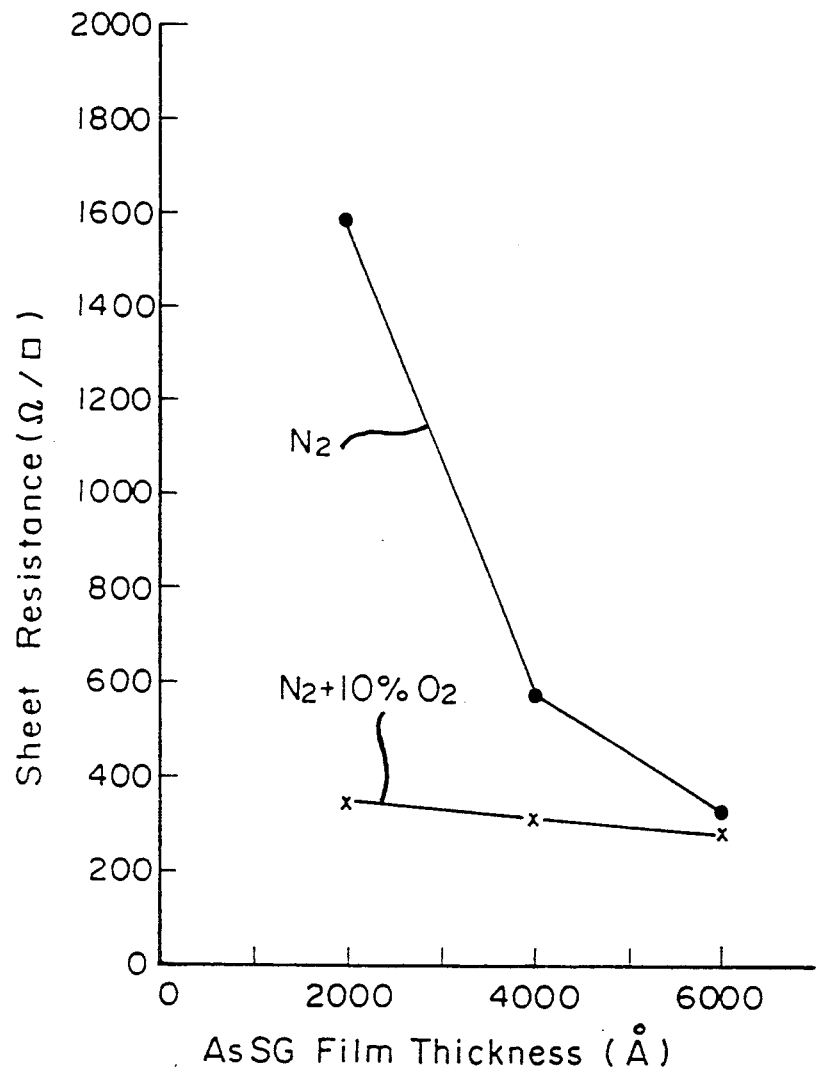
FIG. 8 is a graph showing the relation between the sheet resistance of a polysilicon film and the thickness of an AsSG film.

In the experiment shown in FIG. 6, the thickness of the AsSG film was 4000 angstroms (0.4 microns). A further experiment was conducted wherein the thickness of the AsSG film and the atmospheric gas composition were changed. In this experiment, the conditions used in (c) of FIG. 6 were used, i.e. the AsSG film contained 25 wt % of $As_2O_3$, the polysilicon film had a thickness of 1500 angstroms, and the thermal treatment was carried out at 1000° for 60 minutes. The results of the experiment are shown in FIG. 8. As will be seen from FIG. 8, the sheet resistance of the polysilicon does not reach approximately 300Ω in an atmosphere of $N_2$ if the thickness of the AsSG film is as large as 6000 angstroms, whereas the sheet resistance of the polysilicon reaches approximately 300 Ω for a 2000 angstrom thick AsSG film in an atmosphere of $N_2$ and 10% $O_2$.

Figure 9:
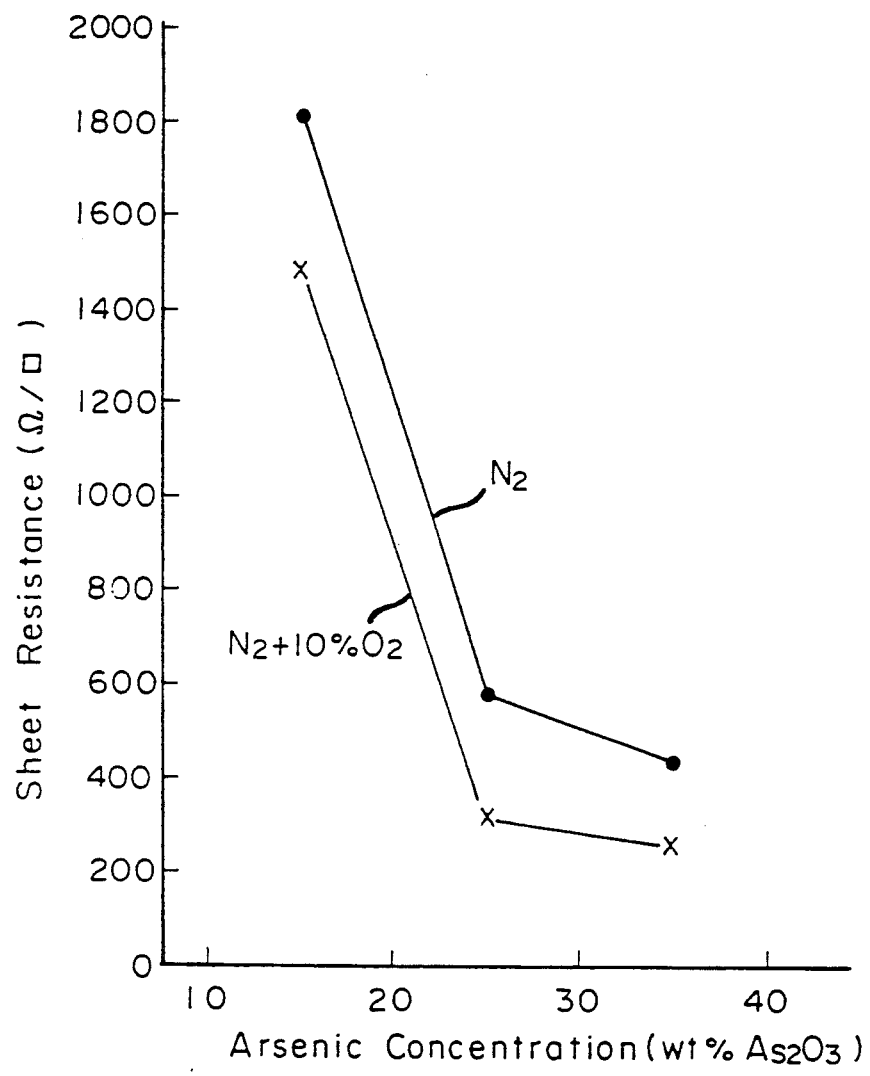
FIG. 9 is a graph showing the relation between the sheet resistance of a polysilicon film and the concentration of arsenic in an AsSG film.

Moreover, the concentration of $As_2O_3$ in the AsSG film and the atmospheric gas were changed. The other conditions were the same as those of the experiment of FIG. 8 and the thickness of the AsSG film was 4000 angstroms. As will be seen from the results shown in FIG. 9, the AsSG film should contain not less than about 25 wt % of $As_2O_3$ and the atmospheric gas should be $N_2+10\%$ $O_2$. Otherwise, the sheet resistance of the polysilicon film does not reach approximately 300 Ω.

From the above experimental results, it has been found that the following conditions are sufficient to incorporate an impurity in the polysilicon film.
1. As is introduced by thermal diffusion from the AsSG film into the polysilicon film formed on an insulating film.
2. The concentration of arsenic in the AsSG film should be not less than about 25 wt %, calculated as $As_2O_3$.
3. The thermal treatment is carried out at not lower than about 1000° for not shorter than 60 minutes.
4. The thermal treatment occurs in an atmosphere of a mixed gas of $N_2+O_2$ with the ratio of the oxygen partial pressure of the total gas pressure being between 0.5/1 and 0.7/1 ratio in the gas of 0.05–0.7.

Capacitors using the polysilicon film formed under the above-described conditions as a capacitor electrode are described.

Figure 10A:
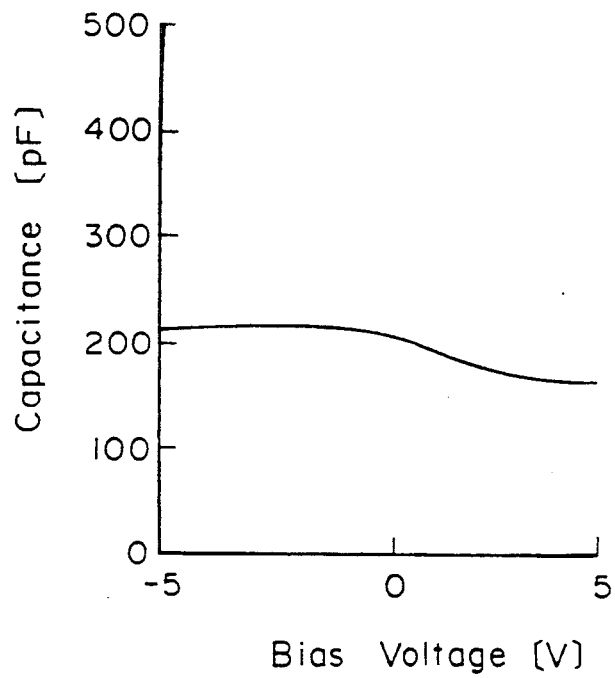
FIG. 10 is a graph showing the relation between the capacitance of a stacked capacitor and the bias voltage.
Figure 10B:
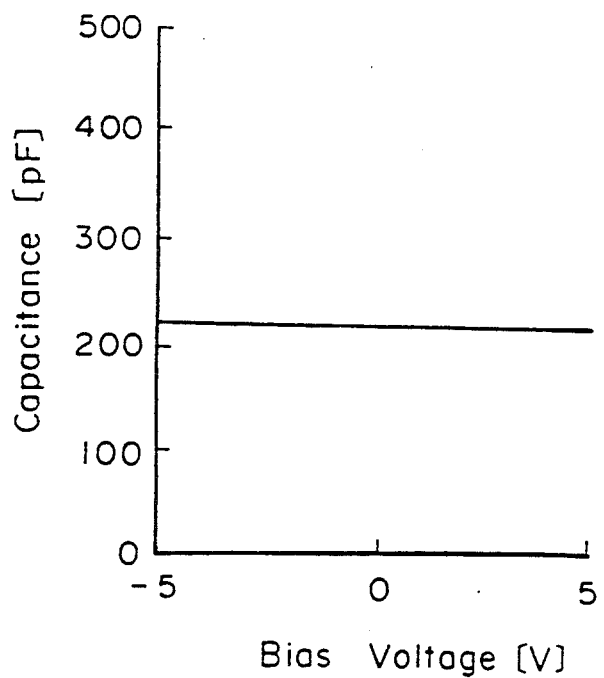

FIG. 10 is a graph showing the relations between the capacitance of a stacked capacitor in the groove and the bias voltage wherein FIG. 10(a) is for prior art and FIG. 10(b) is for the present invention.

The measurement is made by varying a bias voltage of from −5V to 5V under conditions of a frequency of 1 MHz. The opening of the groove is $0.8 \times 0.8$ μm² with a depth of about 4 μm and a number of grooves of 5000.

With the case of a known thermal treatment in an atmosphere of $N_2$ as shown in FIG. 10(a), the capacitance decreases at the + side of the bias voltage. When the thermal treatment is effected in an atmosphere of a mixed gas of $N_2$ and $O_2$ as shown in FIG. 10(b) according to the invention, little decrease in the capacitance is observed even at the + side of the bias voltage, ensuring formation of a satisfactory capacitor electrode.

In the above measurement, the wafer is moved around while revolving on its axis in order to obtain a good step coverage of the AsSG film and the AsSG film thickness on the surface of the silicon substrate is controlled to be in the range of approximately 2000–6000 angstroms. The AsSG film has a content of $As_2O_3$ of about 25–30 wt %.

Figure 1F:
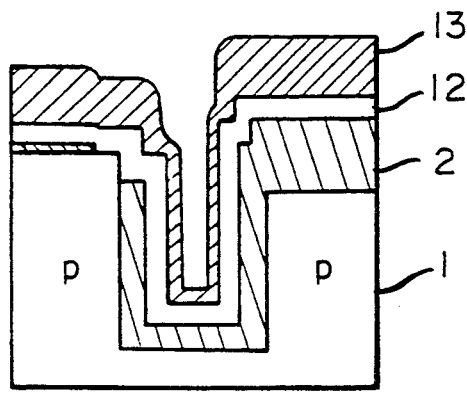
Figure 1G:
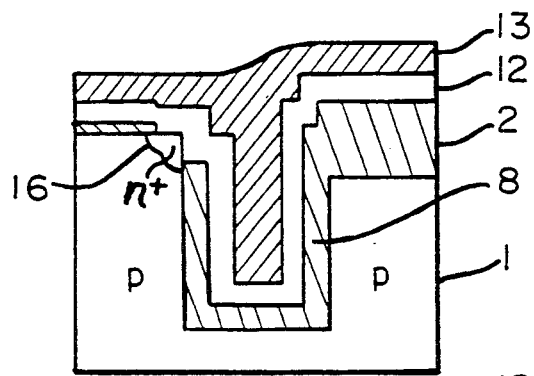

Turning now back to FIG. 1(f), the process is further illustrated.

Prior to the thermal treatment, the AsSG film 13 on the side walls and the bottom of the groove is very thin. After the thermal treatment, the groove is filled with the AsSG film 13 owing to the good fluidity of the AsSG film 13. By the thermal treatment, part of arsenic is diffused into the silicon substrate, thereby forming an N+ diffused layer 16 of the cell contact portion [see FIG. 1(g)].

After removal of the AsSG film 13, the polysilicon film 12 used as the capacitor electrode is patterned according to the photolithography.

A silicon nitride film 17 serving as a capacitor dielectric thin film is deposited on the patterned polysilicon film 12 in a thickness of approximately 10–15 nm according to a reduced pressure CVD method. For the purpose of lowering a defective density of the silicon nitride film and increasing a dielectric strength, the thermal treatment is effected at approximately 900° C. in an atmosphere of wet oxygen. Further, a polysilicon film 18 serving as a cell plate electrode of the capacitor is deposited in a thickness of approximately 1500–2000 angstroms according to a reduced pressure CVD method, and phosphorus (P) is introduced into the polysilicon film at a high concentration according to a thermal diffusion method using $POCl_3$.

Figure 1H:
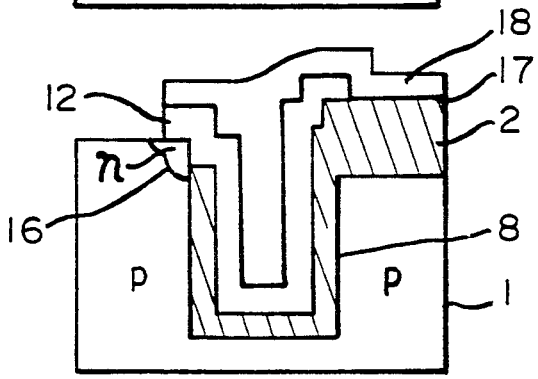

Using photolithography, the polysilicon film 18 and the silicon nitride film 17 are subjected to patterning [see FIG. 1(h)].

A gate oxide film 19 of the transfer gate transistor is grown up in a thickness of 15–20 nm by thermal oxidation. A polysilicon film serving as a gate electrode 20 is entirely deposited, followed by introducing phosphorus by thermal diffusion and patterning. Subsequently, arsenic is ion-implanted to form an N+ diffused layer 21. Thereafter, a layer insulating film 22 is deposited over the entire surface.

A contact hole 23 for the diffused layer 21 and a bit wire is made in the layer insulating film 22. The bit wire 24 is formed, for example, of an Al-Si alloy.

Figure 1I:
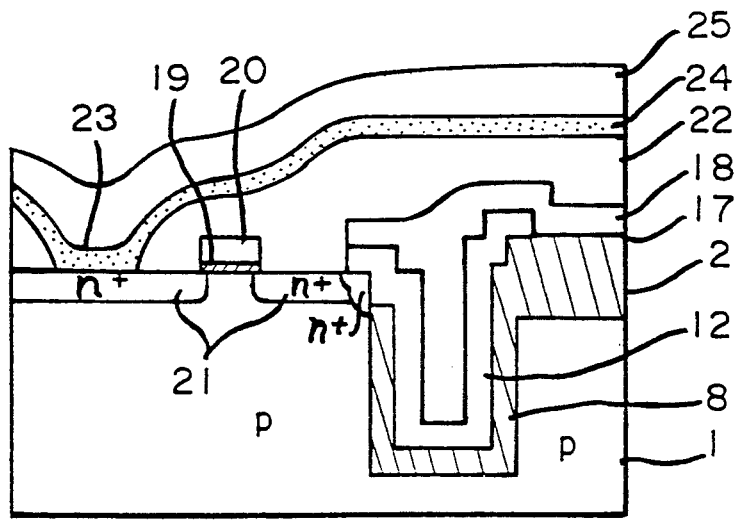
Figure 2:
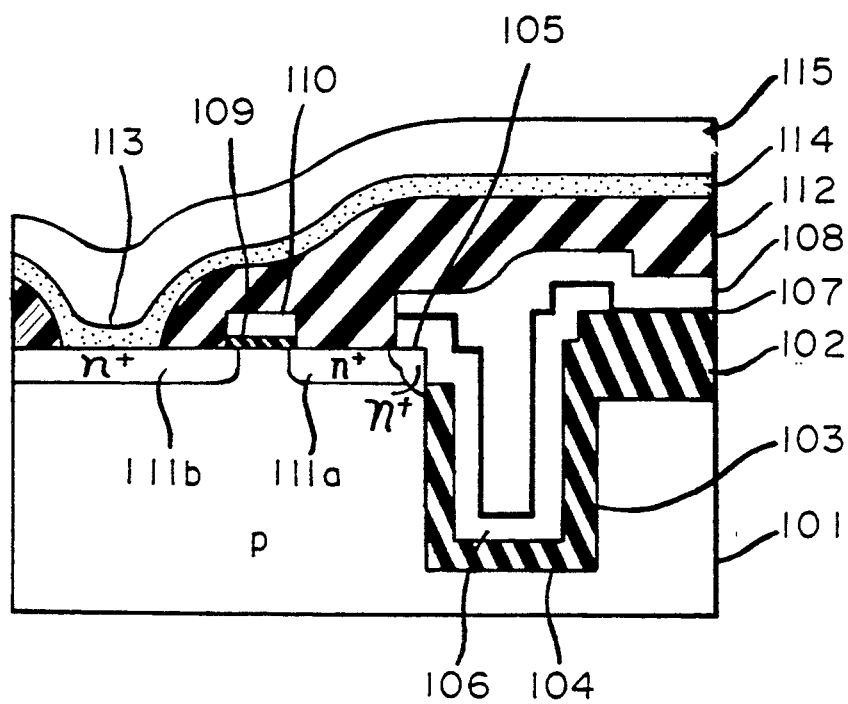
FIG. 2 is a sectional view of a prior art DRAM cell.

Finally, a silicon nitride film is deposited over the entire surface as a passivation film 25 to obtain a semiconductor memory having the DRAM cell [see FIG. 1(i)].

INDUSTRIAL UTILIZATION

As described hereinbefore, the method for fabricating a semiconductor device according to the invention can be utilized when a polysilicon film is formed on an insulating film and is imparted with electric conductivity. As is particularly described in the embodiments, the method can be used to form the capacitor electrode and is adapted for use in the fabrication of DRAM.

I claim:

1. A method for fabricating a semiconductor device comprising the steps of:
   forming a polysilicon layer on an insulating film;
   forming on the polysilicon layer a silicate glass layer wherein a concentration of arsenic is not less than 25 wt %, calculated as $As_2O_3$; and then
   introducing arsenic into the polysilicon layer by thermal treatment in an atmosphere of a mixed gas of oxygen and nitrogen with the ratio of the oxygen partial pressure to the total gas pressure being between 0.05/1 and 0.7/1 at a temperature of not lower than 1000° C. for not shorter than 60 minutes.

2. A method for fabricating a semiconductor device according to claim 1, wherein said insulating film is formed on a semiconductor substrate.

3. A method for fabricating a semiconductor device according to claim 1, wherein said insulating film is a silicon oxide film.

4. A method for fabricating a stacked capacitor comprising the steps of:
   forming a groove in a semiconductor substrate;
   forming a first insulating film on inner walls of said groove;
   forming a polysilicon layer on the first insulating film;
   forming on the polysilicon layer a silicate glass layer wherein a concentration of arsenic is not less than 25 wt % calculated as $As_2O_3$;
   subjecting the polysilicon film to thermal treatment in an atmosphere of a mixed gas of $N_2$ and $O_2$ with an oxygen partial pressure ratio of 0.05–0.7 at not lower than 1000° C. for not less than 60 minutes to render the polysilicon film electrically conductive;
   removing the silicate glass layer;
   forming a second insulating film on the conductive polysilicon film; and
   forming an electrode layer on the second insulating film.

5. A method for fabricating a stacked capacitor according to claim 4, wherein after the formation of the first insulating film, part of the groove at a shoulder portion thereof is removed.

6. A method for fabricating a stacked capacitor according to claim 4, wherein said semiconductor substrate is provided with a field oxide film.

7. A method for fabricating a stacked capacitor according to claim 5, wherein said groove is formed at an end portion of the field oxide film.

8. A method for fabricating a semiconductor device comprising the steps of:
   forming on a polysilicon layer a silicate glass layer wherein a concentration of arsenic is not less than 25 wt %, calculated as $As_3O_2$, and
   introducing arsenic into the polysilicon layer by thermal treatment in an atmosphere of a mixed gas of oxygen and nitrogen with the ratio of the oxygen partial pressure to the total gas pressure being between 0.05/1 and 0.7/1 at a temperature of not lower than 1000° C. for not shorter than 60 minutes.

9. A method for fabricating a semiconductor device according to claim 1, further comprising the step of performing said thermal treatment in one step.

10. A method for fabricating a semiconductor device according to claim 4, further comprising the step of performing said thermal treatment in one step.

* * * * *